United States Patent [19]
Wilson et al.

[11] Patent Number: 5,112,772
[45] Date of Patent: May 12, 1992

[54] METHOD OF FABRICATING A TRENCH STRUCTURE

[75] Inventors: Syd R. Wilson, Phoenix; Han-Bin K. Liang, Mesa; Thomas Zirkle; Yee-Chaung See, both of Phoenix, all of Ariz.

[73] Assignee: Motorola, Inc., Schaumburg, Ill.

[21] Appl. No.: 766,316

[22] Filed: Sep. 27, 1991

[51] Int. Cl.[5] .................... H01L 21/76; H01L 21/302
[52] U.S. Cl. ........................................ 437/67; 437/61; 437/62; 437/63; 437/72; 437/968
[58] Field of Search ....................... 437/62, 63, 67, 68, 437/72, 61, 968

[56] References Cited

U.S. PATENT DOCUMENTS

| | | | |
|---|---|---|---|
| 4,509,249 | 4/1985 | Goto et al. | 437/67 |
| 4,994,406 | 2/1991 | Vasquez et al. | 437/67 |
| 5,061,653 | 10/1991 | Teng | 437/67 |

*Primary Examiner*—Brian E. Hearn
*Assistant Examiner*—Trung Dang
*Attorney, Agent, or Firm*—Harry Wolin

[57] ABSTRACT

A method of fabricating a trench structure includes providing a substrate having a first layer disposed on a surface thereof and a second layer disposed on the first layer. A trench is formed through the first and second layers and into the substrate. A dielectric liner is formed on the sidewalls of the trench which is then filled with a trench fill material. Portions of the trench liner disposed above the trench fill material are removed and a conformal layer is then formed on the trench structure. The conformal layer and a portion of the trench fill material are then oxidized.

14 Claims, 2 Drawing Sheets

METHOD OF FABRICATING A TRENCH STRUCTURE

FIELD OF THE INVENTION

This invention relates, in general, to the semiconductor arts and more particularly to a method of fabricating a trench structure.

BACKGROUND OF THE INVENTION

Trench structures are widely used in the semiconductor arts. Trenches may be used for a variety of purposes although they are most commonly used for isolation. Trench isolation may be utilized to isolate devices, CMOS portions and the like.

Polysilicon buffered LOCOS (PBL) is commonly used to form field oxidation regions in semiconductor structures. Typically, a substrate is provided and an oxide layer is formed thereon. A polysilicon layer is formed on the oxide layer and a nitride layer is formed on the polysilicon layer. An opening is formed through the nitride layer that exposes the polysilicon layer. Once the polysilicon layer is exposed, it and the substrate are thermally oxidized to form field oxidation regions. The PBL thermal oxidation step results in birds beak encroachment as is well known in the art. This encroachment is undesirable and does not allow PBL to be a viable isolation scheme in very small geometry structures.

PBL is commonly employed with nitride spacers. Following the formation of the opening, nitride spacers are formed on the sidewalls thereof. This allows the opening to have a width that is less than standard lithography resolution limits will allow. PBL utilized with nitride spacers is referred to frame masked polysilicon buffered LOCOS (FMPBL).

The basic integration of FMBPL and trench technology to form field oxidation regions above isolation trenches would appear to have many desirable features. However, this integration also renders substantial processing problems. Specifically, following the formation of a trench including a liner and polysilicon trench fill, the liner is etched back below the surface of the polysilicon trench fill. This etch back causes a recessed surface or divots in the liner. When nitride spacers are formed, nitride residue remains in the divots. During later processing steps, specifically when an oxide cap is grown over the trench, no oxide grows over the nitride in the divots. Therefore, when polysilicon is subsequently deposited and patterned over the trench, polysilicon stringers are formed in the divots. These polysilicon stringers are detrimental to semiconductor processing, final device performance and yield.

Accordingly, it would be highly desirable to have a method of fabricating a trench structure that would allow the desired features of FMPBL and trench technology without having the common problems associated with the integration of these technologies.

SUMMARY OF THE INVENTION

A method of fabricating a trench structure includes providing a substrate having at least a first layer disposed on a surface thereof and a second layer disposed on the first layer. A trench is formed through the first and second layers and into the substrate. A dielectric liner is formed in the trench. The trench is filled with trench fill material which extends above the surface of the substrate. Portions of the trench liner disposed above the trench fill material in the trench are removed and a conformal layer is formed over the surface of the entire structure, namely the trench and the second layer. The conformal layer is then oxidized.

DETAILED DESCRIPTION OF THE DRAWINGS

Figure 3:
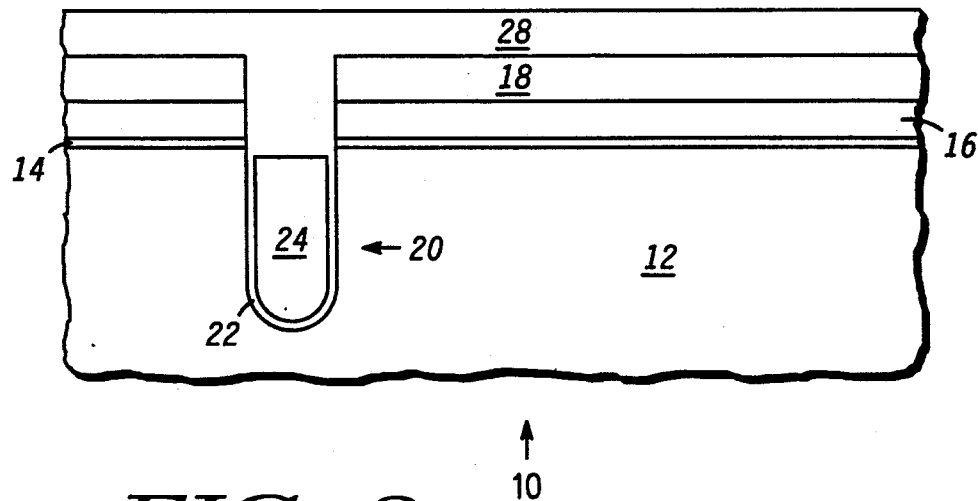
Figure 4:
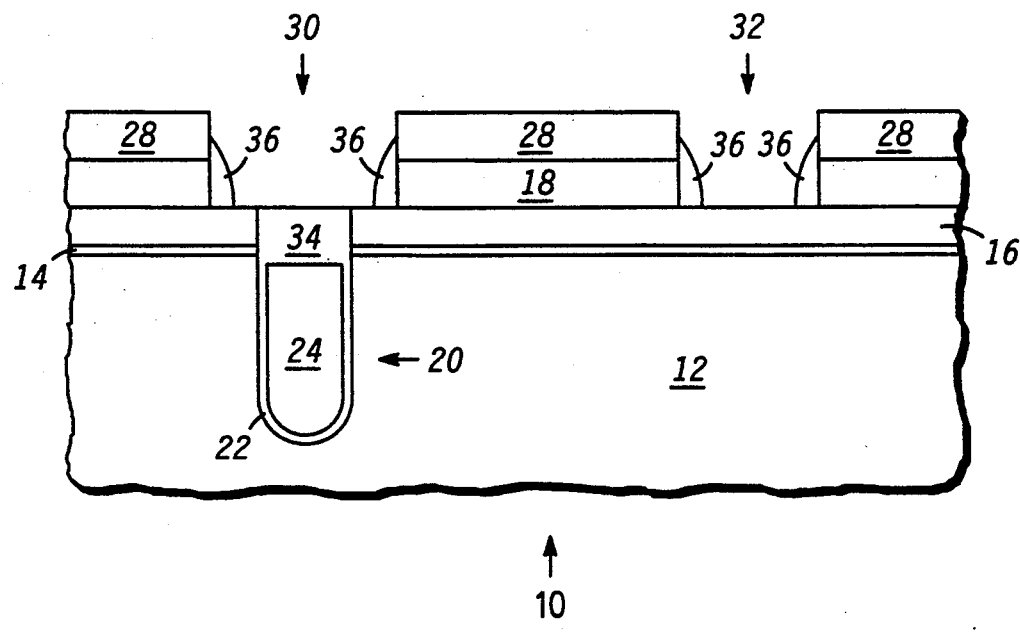
Figure 5:
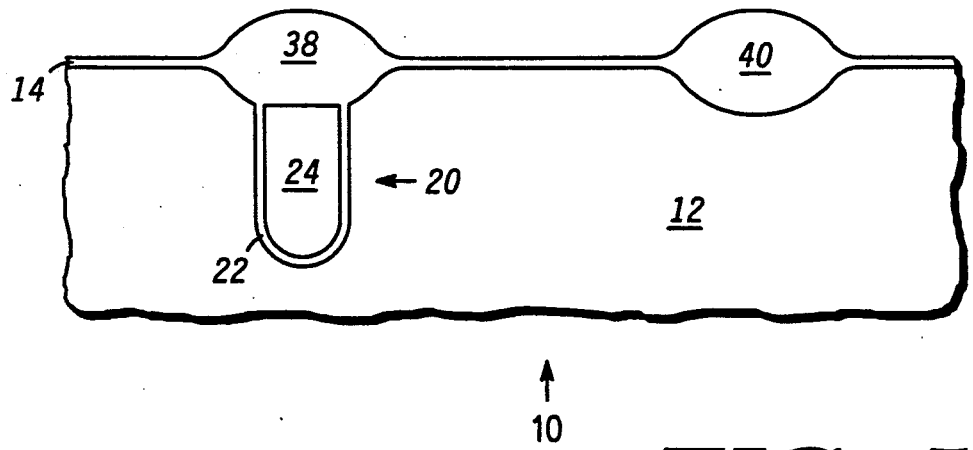
FIG. 5 is a highly enlarged cross-sectional view of a portion of a trench structure.

FIGS. 1-4 are highly enlarged cross-sectional views of a portion of a trench structure 10 during processing while FIG. 5 is a highly enlarged cross-sectional view of a portion of trench structure 10. FIGS. 1-5 are not to scale. Trench structures such as structure 10 have many uses in the semiconductor arts. Trench structure 10 as shown herein will preferably be used for isolation applications. Trench structure 10 may be employed as an isolation module for BICMOS integrated circuits having submicron features.

Figure 1:
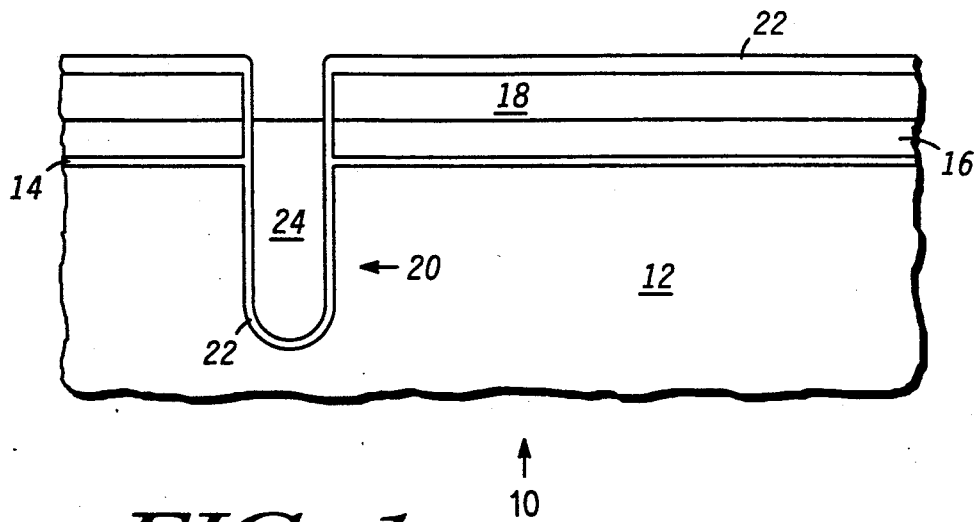
FIGS. 1-4 are highly enlarged cross-sectional views of a portion of a trench structure during processing.

Now referring specifically to FIG. 1. Structure 10 includes a substrate 12. As shown herein, substrate 12 comprises monocrystalline silicon although it should be understood that the present invention may be employed with substrates of material other than silicon. An oxide layer 14 is formed on substrate 12. Oxide layer 14 is preferably formed by thermally oxidizing substrate 12. Oxide layer 14 should have a thickness in the range of 100 to 500 angstroms and preferably on the order of 150 angstroms. A polysilicon layer 16 is formed on oxide layer 14. Polysilicon layer 16 is formed by LPCVD as is well known in the art. Preferably, polysilicon layer 16 will have a thickness in the range of 350 to 1000 angstroms. A nitride layer 18 is formed on polysilicon layer 16. Nitride layer 18 is also formed by LPCVD. Preferably, nitride layer 18 will have a thickness in the range of 1000 to 2500 angstroms.

A trench 20 is formed through nitride layer 18, polysilicon layer 16 and oxide layer 14 into substrate 12. Trench 20 will preferably extend 3.0 to 6.0 micrometers into substrate 12 although this depth may be varied. Trench 20 may be formed by methods well known in the art. Preferably, a trench photoresist layer (not shown) is formed on nitride layer 18 and a window for trench 20 is patterned therein. Reactive ion etching is employed to remove the portion of nitride layer 18 disposed in the trench window. Well known nitride etching chemistries may be employed. Following the etching of nitride layer 18, the trench photoresist is removed and reactive ion etching is then employed to etch through polysilicon layer 16, oxide layer 14 and substrate 12. Well known chemistries may be employed to etch oxide and silicon. The previously etched opening in nitride layer 18 serves as a window for the etch of polysilicon layer 16, oxide layer 14 and substrate 12.

For specific applications, it may be desirable to deposit a hardmask oxide layer on top of nitride layer 18 prior to trench formation. This oxide may be a low temperature deposited oxide or a plasma enhanced TEOS oxide. Preferably, this oxide would have a thickness in the range of 2000 to 4000 angstroms. The trench photoresist layer would then be formed on the hardmask oxide layer. The hardmask oxide layer would be removed following the etching of trench 20.

The inside of trench 20 is cleaned following its formation. The trench clean may be performed simultaneously with the removal of the optional hardmask oxide layer if employed. The trench clean may also be used to remove a desired amount of silicon from trench 20 if desired. Once trench 20 has been cleaned, specific applications may desire that a channel stop (not shown) is formed beneath trench 20 in substrate 12. A channel stop may be formed by methods well known in the art. A channel stop will not be necessary for the majority of applications if substrate 12 is highly doped.

Following cleaning of trench 20, a trench liner 22 is formed therein. Trench liner 22 comprises oxide as shown herein. Oxide trench liner 22 may be thermally grown, deposited or a combination of thermally grown and deposited oxides. Trench liner 22 will have a thickness in the range of 1000 to 2500 angstroms. Preferably, trench liner 22 is fabricated by forming a conformal oxide layer over the entire structure including in trench 20 and later removing the unwanted portions of the conformal layer. This will be explained presently.

Following the formation of trench liner 22, lined trench 20 is filled with polysilicon 24. Polysilicon trench fill 24 is preferably formed by forming a conformal polysilicon layer on the surface of structure 10. The conformal layer will have a thickness in the range of 6000 to 8000 angstroms. This, of course, is dependent upon the width of trench 20. For specific applications, it may be desired that polysilicon trench fill 24 contact substrate 12. If so desired, the portion of trench liner 22 disposed in the bottom of trench 20 may be removed prior to the formation of polysilicon trench fill 24.

Following the formation of the conformal polysilicon layer, a planarizing layer comprising a resin, spin-on glass or similar well known material (not shown) is formed over the surface of structure 10. The planarization layer and the conformal polysilicon layer are etched to leave polysilicon trench fill 24 recessed in trench 20. It should be understood that the etchants used to etch the planarization layer and the conformal polysilicon layer should be selective so that it does not etch any of the oxide layer from which trench liner 22 is formed. This will most likely require a two step etch wherein the planarizing layer and a portion of the conformal polysilicon layer are initially etched and a second step employing a polysilicon etchant selective to oxide and nitride.

Figure 2:
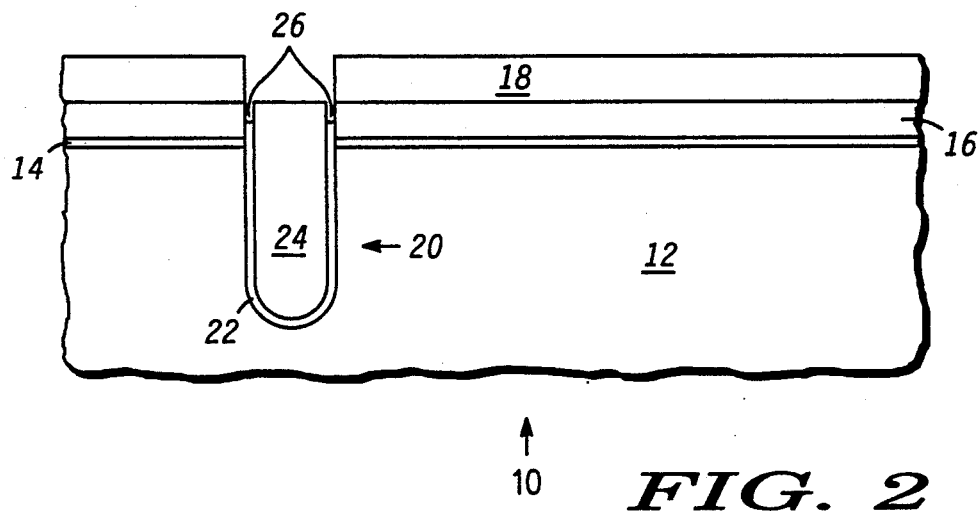

Once the unwanted portion of the conformal polysilicon layer from which trench fill 24 is formed has been etched away, the portions of the conformal oxide layer which forms trench liner 22 or any portions of trench liner 22 disposed above trench fill 24 are then etched away as is shown in FIG. 2. Etching trench liner 22 beneath the top surface of trench fill 24 leaves divots 26. Divots 26 are extremely detrimental to future processing steps, final device performance and yield.

Now referring specifically to FIG. 3. A conformal polysilicon layer is formed over the entire surface of structure 10 including in divots 26 and above polysilicon trench fill 24. The conformal polysilicon layer has a thickness of between 500 and 2000 angstroms although a thickness on the order of 800 angstroms is preferred. Following its deposition, the conformal polysilicon layer is thermally oxidized to form oxidized layer 28. The thermal oxidation of layer 28 should be such that a portion of polysilicon trench fill 24 is consumed. Following the thermal oxidation of layer 28, the top surface of polysilicon trench fill 24 should be equal to or below the top surface of substrate 12. It is also desireable that the surface of oxidized layer 28 be formed as planar as possible. The oxidation of layer 28 fills in divots 26.

Following the oxidation of layer 28, oxidized layer 28 is planarized and etched back. Preferably, oxidized layer 28 will be etched back to a thickness over nitride layer 18 in the range of 50 to 750 angstroms with a preferable thickness on the order of 300 angstroms. Planarization and etch back of oxidized layer 28 may occur by methods well known in the art including an isotropic wet etch with a buffered HF solution or a resin or spin-on glass layer may be applied to planarize oxidized layer 28 and then etched back so that layer 28 will have the desired thickness.

Following the planarization and etch back of oxidized layer 28, a photoresist layer (not shown) is formed and patterned on oxidized layer 28. The photoresist layer is patterned so that a window is disposed above trench 20. The window disposed above trench 20 will have a width that is laterally greater than the width of trench 20 itself. This window will be used to form opening 30 as is shown in FIG. 4. Another window is formed in the photoresist layer and is laterally removed from trench 20. The second opening removed from trench 20 will be employed to create opening 32 as is also shown in FIG. 4.

Once the photoresist windows have been formed, openings 30 and 32 are formed. To form openings 30 and 32, portions of oxidized layer 28 and nitride layer 18 are etched away. Preferably, no portions of polysilicon layer 16 are removed in this step. An RIE etch having a substantially 1:1 oxidenitride selectivity as is well known in the art may be used. It should be understood that the etchant must also be selective so that it will not significantly damage polysilicon layer 16. During the etch of openings 30 and 32, the portions of oxidized layer 28 disposed directly above polysilicon trench fill 24 is etched so that only an oxide cap 34 remains.

Following the formation of openings 30 and 32, nitride spacers 36 are formed. Nitride spacers 36 are formed on polysilicon layer 16 and extend upward along the sidewalls of openings of 30 and 32 above the interface of nitride layer 18 and oxidized layer 28. Nitride spacers 36 are fabricated by forming a conformal nitride layer over the surface of structure 10 and anisotropically etching the conformal nitride layer to leave spacers 36. It should be understood that oxidized layer 28 and polysilicon layer 16 serve as an etch stop for the etch of nitride spacers 36.

Now referring specifically to FIG. 5. Following the formation of nitride spacers 36, field oxidation region 38 is formed above trench 22 in opening 30 and field oxidation region 40 is formed in opening 32. Field oxidation regions 38 and 40 are formed by thermally oxidizing polysilicon layer 16 and substrate 12 and in the case of region 38, polysilicon trench fill 24. Following the formation of field oxide regions 38 and 40, the remaining portions of oxidized layer 28, nitride layer 18, unoxidized polysilicon layer 16 and nitride spacers 36 are removed from the surface of structure 10 as shown in FIG. 5. Trench structure 10 as depicted in FIG. 5 is an isolation module that may be used for bipolar or BICMOS applications and is now ready to have device processing begin thereon. Although field oxidation regions 38 and 40 and trench 22 are specifically configured in FIG. 5, it should be understood that the present invention may be employed with different configurations including variable numbers of trenches and field oxidation regions.

The method of fabricating a trench structure disclosed herein is ideal for use in fabricating integrated circuits wherein the devices have submicron features. The integration of FMPBL which has reduced encroachment of the field oxidation regions with trench technology for isolation is superior. The divots formed during the etch back of trench liner 22 are remedied by the formation of oxidized layer 28 which precludes the later formation of polysilicon stringers. Accordingly, future processing problems are greatly reduced, final device performance is enhanced and yield is increased.

Thus it is apparent that there has been provided, in accordance with the invention, an improved method of fabricating a trench structure. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating a trench structure comprising the steps of:
   providing a substrate having at least a first layer disposed on a surface thereof and a second layer disposed on said first layer;
   forming a trench through said first and second layers and into said substrate;
   forming a dielectric liner in said trench, said liner extending above said surface of said substrate;
   forming trench fill material in said trench, said trench fill material extending above said surface of said substrate;
   removing portions of said trench liner disposed above said trench fill material;
   forming a conformal layer on said structure including said trench and said second layer; and
   oxidizing said conformal layer and a portion of said trench fill material.

2. The method of claim 1 further including forming an opening in the oxidized conformal and second layers adjacent the trench and forming spacers abutting said second layer in said opening.

3. The method of claim 2 wherein a field oxidation region is formed in the opening above the trench.

4. The method of claim 3 further including the steps of:
   forming at least one opening in the oxidized conformal and second layers removed from the trench;
   forming spacers abutting said second layer in said at least one opening removed from said trench; and
   forming a field oxidation region in said at least one opening removed from said trench.

5. The method of claim 4 wherein an oxide layer is formed on the substrate, the first layer comprises polysilicon, the second layer comprises nitride, the dielectric liner comprises oxide and the trench fill material comprises polysilicon.

6. A method of fabricating a trench structure comprising the steps of:
   providing a silicon substrate having an oxide layer disposed on a surface thereof, a polysilicon layer disposed on said oxide layer and a nitride layer disposed on said polysilicon layer;
   forming a trench through said nitride, polysilicon and oxide layers and into said substrate;
   forming an oxide layer in said trench, said liner extending above said surface of said substrate;
   forming polysilicon in said trench, said polysilicon extending above said surface of said substrate;
   removing portions of said oxide liner disposed above said polysilicon in said trench;
   forming a conformal polysilicon layer on the surface of the structure including said trench and said nitride layer;
   oxidizing said conformal polysilicon layer and a portion of the polysilicon disposed in said trench;
   forming an opening in said oxidized conformal layer and said nitride layer adjacent said trench;
   forming nitride spacers abutting said nitride layer in said opening; and
   forming a field oxidation region in said opening above said trench.

7. The method of claim 6 further including the steps of:
   forming at least one opening in the oxidized conformal and nitride layers removed from said trench;
   forming nitride spacers abutting said nitride layer in said at least one opening removed from said trench; and
   forming a field oxidation region in said at least one opening removed from said trench.

8. The method of claim 6 wherein the oxidized conformal layer is planarized.

9. The method of claim 8 wherein the oxidized conformal layer is planarized by etching with an HF solution or by applying resin or spin-on-glass to the surface of said oxidized conformal layer.

10. The method of claim 7 wherein the forming openings step includes RIE etching and the polysilicon layer serves as an etch stop.

11. A method of fabricating a trench structure having field oxidation regions comprising the steps of:
    providing a silicon substrate having an oxide layer disposed on a surface thereof, a polysilicon layer disposed on said oxide layer and a nitride layer disposed on said polysilicon layer;
    forming a trench in said substrate through said oxide, polysilicon and nitride layers;
    forming an oxide liner in said trench, said liner extending above said surface of said substrate;
    filling said trench with polysilicon, said polysilicon trench fill extending above said surface of said substrate;
    removing portions of said oxide liner disposed above said polysilicon in said trench;
    forming a conformal polysilicon layer on the surface of the structure including said trench and said nitride layer;
    oxidizing said conformal polysilicon layer and a portion of said polysilicon in said trench;
    forming openings in said oxidized conformal and said nitride layer both adjacent and removed from said trench;
    forming nitride spacers abutting said nitride layer in said openings; and
    forming field oxidation regions in said openings.

12. The method of claim 11 wherein the oxidized conformal layer is planarized.

13. The method of claim 12 wherein the oxidized conformal layer is planarized by etching with an HF solution or by applying resin or spin-on-glass to the surface of said oxidized conformal layer.

14. The method of claim 11 wherein the forming openings step includes RIE etching wherein the polysilicon layer serves as an etch stop.

* * * * *